(12) United States Patent
Matsuzawa et al.

(10) Patent No.: US 6,343,365 B1
(45) Date of Patent: Jan. 29, 2002

(54) LARGE-SCALE INTEGRATED CIRCUIT AND METHOD FOR TESTING A BOARD OF SAME

(75) Inventors: Hajime Matsuzawa; Hiroo Ito, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/185,636

(22) Filed: Nov. 4, 1998

(30) Foreign Application Priority Data

Feb. 17, 1998 (JP) .......................................... 10-051524

(51) Int. Cl.$^7$ ............................................... G01R 31/28
(52) U.S. Cl. .......................... 714/726; 714/30; 714/727; 714/729; 365/201
(58) Field of Search ........................ 714/724, 726–728, 714/729, 731, 738, 735, 30, 33, 733, 736.7, 814, 802, 739, 730–734, 725, 56, 43; 326/57, 16, 39–40, 126–127; 324/769, 158.1, 73.1, 763; 716/3; 365/200–201; 710/100; 327/199; 340/825.5; 368/113, 118, 120; 377/70, 47, 54, 75, 77; 370/462

(56) References Cited

U.S. PATENT DOCUMENTS 5,056,093 A * 10/1991 Whetsel ...................... 714/729
5,453,992 A * 9/1995 Whetsel ...................... 714/730
5,911,039 A * 6/1999 Hashizume et al. .......... 714/30

FOREIGN PATENT DOCUMENTS

| JP | 5-60835 | 3/1993 | ........... G01R/31/28 |
| JP | 6-194416 | 7/1994 | ........... G01R/31/28 |
| JP | 06-289099 | 10/1994 | ........... G01R/31/28 |
| JP | 07-35817 | 2/1995 | ........... G01R/31/28 |

OTHER PUBLICATIONS

Inoue et al., "Board–level testing by an I/O scan method", *17$^{th}$ Symposium on LSI Testing*, Dec. 11, 1997, pp. 174–179.
Burgess, et al. (The boundary scan; IEEE, Sep. 1995).*
Wuudiann. (Backplane interconnect test in a boundary–scan environment; IEEE, Oct. 25, 1996).*
Choi,et al. Contiguration of a Boundary Scan Chain for Optimal Testing of Clusters of non–Boundary Scan Devices.*
Choi,et al. (Configuring multiple boundary scan chains for board testing; IEEE, May 3, 1995).*
Inoue et al., "Board–level testing by an I/O scan method", 17$^{th}$ Symposium on LSI Testing, Dec. 11, 1997, pp. 174–179.

* cited by examiner

Primary Examiner—Albert Decady
Assistant Examiner—Guy Lamarre
(74) Attorney, Agent, or Firm—Sughrue Mion, PLLC

(57) ABSTRACT

In a large-scale integrated circuit, a scan path is divided between an I/O scan path that is formed by a series connection between only flip-flops that are in a region near an I/O pin and an internal scan path that is formed by a series connection between other flip-flops. A selector has one of its inputs connected to another end of the I/O scan path and to one end of the internal scan path, another of its inputs connected to another end of the internal scan path, and its output connected to a scan out. This selector, based on a test mode signal, selects either all scan paths or only the I/O scan path.

20 Claims, 4 Drawing Sheets

LARGE-SCALE INTEGRATED CIRCUIT AND METHOD FOR TESTING A BOARD OF SAME

BACKGROUND OF THE INVENTION

1. Field of the Invention

The present invention relates to a large-scale integrated circuit and a method of testing a board thereof, and more particularly to a large-scale integrated circuit, the structure of which has flip-flops that are serially connected, and a method of testing a board using a scan path.

2. Description of the Related Art

As is widely known, in recent years there has been a rapid increase in the scale of large-scale integrated circuits. A shift from bipolar large-scale integrated circuits designed with emphasis high speed to CMOS (complementary metal-oxide semiconductor) large-scale integrated circuits, which enable a high degree of integration and parallel processing forms the backdrop for this increase in the scale of large-scale integrated circuits.

Other factors include the achievement of high-density printed circuit boards that enable blind vias, and a shift away from quad flat packages, in which the electrical connections between a printed circuit board and a large-scale integrated circuit are made by means of a line of connections on each of four sides around a case of the large-scale integrated circuit, in favor of a PGA (pin grid array) or BGA (ball grid array), in which electrodes are arranged in a matrix immediately beneath the large-scale integrated circuit, thereby enabling the accommodation of a large number of pins.

With the appearance of high-density large-scale integrated circuits, it has become difficult to generate a test pattern suitable for board-level testing of a printed circuit board after large-scale integrated circuits have been mounted to the board, and the time required for test pattern generation has increased.

Along with these changes, the scan path length has increased and an amount of the test patterns has been increased, thereby causing an increase in the test time.

A full scan path 34, as shown in FIG. 3, is an example of an easily testable circuit for the purpose of solving the above-noted problem.

The full scan path 34 is the series connection of all the flip-flops 32 and flip-flops 32' that originally existed within the large-scale integrated circuit 31, regardless of whether or not they exist in the region of the input/output pins 33, test data being scanned in and out via the scan in 35 and scan out 36, thereby enabling to set an arbitrary internal condition thereof from outside the device, or to withdraw the internal condition therefrom and to perform observation thereof, at a certain point in time, it is easy to divide the internal circuit of the large-scale integrated circuit 1 and generate a test pattern therefor.

By employing a test that uses the full scan pattern 34, it is not only possible, of course, to test the functions of the large-scale integrated circuit 31, but also to perform tracing so as to identify what constituent component thereof has failed.

The full scan path 34 is simple, in that it can be generated in a single operation by the ATPG (automatic test pattern generator) of a CAD (computer aided design) system, without making a distinction with regard to individual flip-flops of the circuit.

However, with circuit scale being large, data generation times have become unrealistic and failure analysis procedures have become excessively deep, thereby imposing a limit on the failure detection rate that can be achieved in finite amount of time.

As shown in FIG. 4, there is a boundary scan path 47 that is used to achieve an easily testable circuit, this taking notice of only the connections between the large-scale integrated circuit 41, 41.

The boundary scan path 47 is the series connection of not only the circuitry parts (the part 49 that is outside the scope of the simulation, which includes the flip-flops 42) that are originally part of the large-scale integrated circuit 41, but also dedicated boundary scan 48 which is disposed in the region of the I/O pins 43 of the large-scale integrated circuit 41, this being connected in series.

The boundary scan 48 is formed by such parts as a test data register that includes, for example, a scan register that is disposed in parallel with the input/output register, a TAP controller that receives a test command from a test access port and performs control of the execution of a series of procedures, a multiplexer that switches the routing of data between the scanning mode and the actual operating mode, and a decoder for test operating commands.

A board test that employs the boundary scan path 47 has become an IEEE Standard and, because test commands and the transitions between the states thereof have become standardized, from the standpoint of test development and test data generation, efficiency is achieved, without the need for each board test supplier to develop and understand a different language.

However, from the standpoint of the board producer, that is, the developer of the large-scale integrated circuit 41, because it is necessary to devote 5% to 10% of valuable real estate within the large-scale integrated circuit to the purpose of testing, to achieve the desired circuit scale, it is necessary to have a large-scale integrated circuit 41 that is even larger, this increase in size causing an increase in delay times.

In the above-noted prior art, as a result of dramatic advances in the level of integration of LSI devices over those of the past, merely performing circuit division using a full scan path or a boundary scan path resulted in an increase in the size of the circuit, which is an object circuit for simulation procedure, and which led again to an increase in the time required to generate test pattern.

An addition problem is that, at the board level, the scan path length becomes long, thereby causing an increase in the test time.

If main object of a board-level test is the verification of connections between LSI devices, there is the problem that most parts of the generated test pattern do not contribute to the achievement of this object.

Accordingly, an object of the present invention is to provide a large-scale integrated circuit that has a scan path (hereinafter referred to as an I/O scan path) that is formed by a selective serial connection between only flip-flops each of which is in a region near the respective I/O pins of the LSI circuit (including those that are not directly connected to I/O pins but are rather connected thereto via several stages of logic), thereby enabling a shortening of the time required to generate a test pattern, and a shortening of the time required for the test time in board level test.

Another object of the present invention is to provide a board test method which facilitates the verification of connections between LSI circuits that are provided with an I/O scan path, in easy way.

In order to achieve the above-noted objects, a large-scale integrated circuit according to the present invention has a I/O scan path formed by the selective serial connection of only flip-flops that are in a region near I/O pins thereof.

Additionally, an LSI circuit according to the present invention is one having a structure that has a scan path of flip-flops connected in series, this scan path being divided between an I/O scan path 10 of the series connection of only flip-flops that are in a region near I/O pins and an internal scan path 11 of other flip-flops connected in series, and which also has a selector that selects either all the paths of the scan paths or only the paths of the I/O scan path.

Additionally, a large-scale integrated circuit according to the present invention is one having a structure that has a scan path of flip-flops connected in series, this scan path being divided between an I/O scan path 10 of only flip-flops that are in a region near I/O pins and an internal scan path 11 of other flip-flops connected in series, the above-noted LSI circuit also having a selector, one input of which is connected to another end of the above-noted I/O scan path and to one end of the above-noted internal scan path, the other input of which is connected to the other end of the above-noted internal scan path, and the output of which is connected to a scan out, this selector, based on a test mode signal, selecting either all scan paths or only the above-noted I/O scan path.

Additionally, a large-scale integrated circuit according to the present invention is one having a structure that has a scan path of flip-flops connected in series, this scan path being divided into an I/O scan path of only flip-flops each of which is in a region near the respective I/O pins, and an internal scan path of flip-flops other than those as afore-mentioned, connected in series, the above-noted LSI circuit also having a selector, one input of which is connected to a scan in and one end of the above-noted internal scan path, the other input of which is connected to the other end of the internal scan path, and the output of which is connected to one end of the above-noted I/O scan path, this selector, based on a test mode signal, selecting either all scan paths or only the above-noted I/O scan path.

In yet another form, a large-scale according to the present invention is one having a structure that has a scan path of flip-flops connected is series, this scan path being divided into an I/O scan path of only flip-flops each of which is in a region near the respective I/O pins, and a first and second internal scan paths of flip-flops other than those as afore-mentioned, connected in series, the above-noted LSI circuit structure also having a first selector, one input of which is connected to a scan in and to one end of the first internal scan path, the other input of which is connected to the other end of the first internal scan path, and the output of which is connected to one input of the I/O scan path, and a second selector, one input of which is connected to the other end of the above-noted I/O scan path and one end of the second internal scan path, the other input of which is connected to the other end of the second internal scan path, and the output of which is connected to the scan out, wherein based on a test mode signal, the second selector is switched, so as to select either all scan paths or only the above-noted I/O scan path.

Additionally, an LSI circuit according to the present invention is one having a structure that has a scan path of flip-flops connected in series, this scan path being divided into a first and scan I/O scan paths of only flip-flops that are in a region near I/O pins, and an internal scan path of other flip-flops connected in series, and a selector, one input of which is connected to the other end of the first I/O scan path and one end of the internal scan path, the other input of which is connected to the other end of the internal scan path, and the output of which is connected to one end of the second I/O scan path, this selector, based on a test mode signal, selecting either all scan paths or the above-noted I/O scan path.

A method of board testing according to the present invention is one whereby connections are made between I/O pins of a plurality of LSI circuits that have an I/O scan path of flip-flops in each one of a region near the respective I/O pins connected in series, test data is scanned into and scanned out of each of the LSI circuit I/O scan paths, and data is sent and received between the I/O scan paths, so as to perform a verification of connection between the LSI circuits.

Additionally, a method of board testing according to the present invention is a method for testing LSI circuits having a structure that has a scan path of flip-flops connected in series, wherein in the above-noted LSI circuits the above-noted scan path is divided into an I/O scan path of only flip-flops in each one of regions near the respective I/O pins connected in series and an internal scan path of other flip-flops connected in series, whereby connection is made between I/O pins of a plurality of LSI circuits, a selector is employed to select only the I/O scan path, test data is scanned in and out through each of the I/O scan path of the LSI circuits and data is sent and received between the I/O scan paths, so as to perform a verification of connection between the LSI circuits.

Additionally, a board testing method according to the present invention is a method of testing a board of LSI circuits having a structure that has a scan path of flip-flops connected in series, the above-noted scan path being divided into an I/O scan path of only flip-flops in each one of regions near the respective I/O pins connected in series and an internal scan path of other flip-flops connected in series, whereby connection is made between the I/O pins of a plurality of LSI circuits, a testing mode signal being applied from the outside, thereby causing a selector to select only the I/O scan path, test data being scanned into and out through the I/O scan path of each LSI circuit, and data being sent and received between the I/O scan paths, so as to perform a verification of connections between the LSI circuits.

DESCRIPTION OF THE PREFERRED EMBODIMENTS

Preferred embodiments of the present invention will be described in detail below, with reference being made to relevant accompanying drawings.

Figure 1:
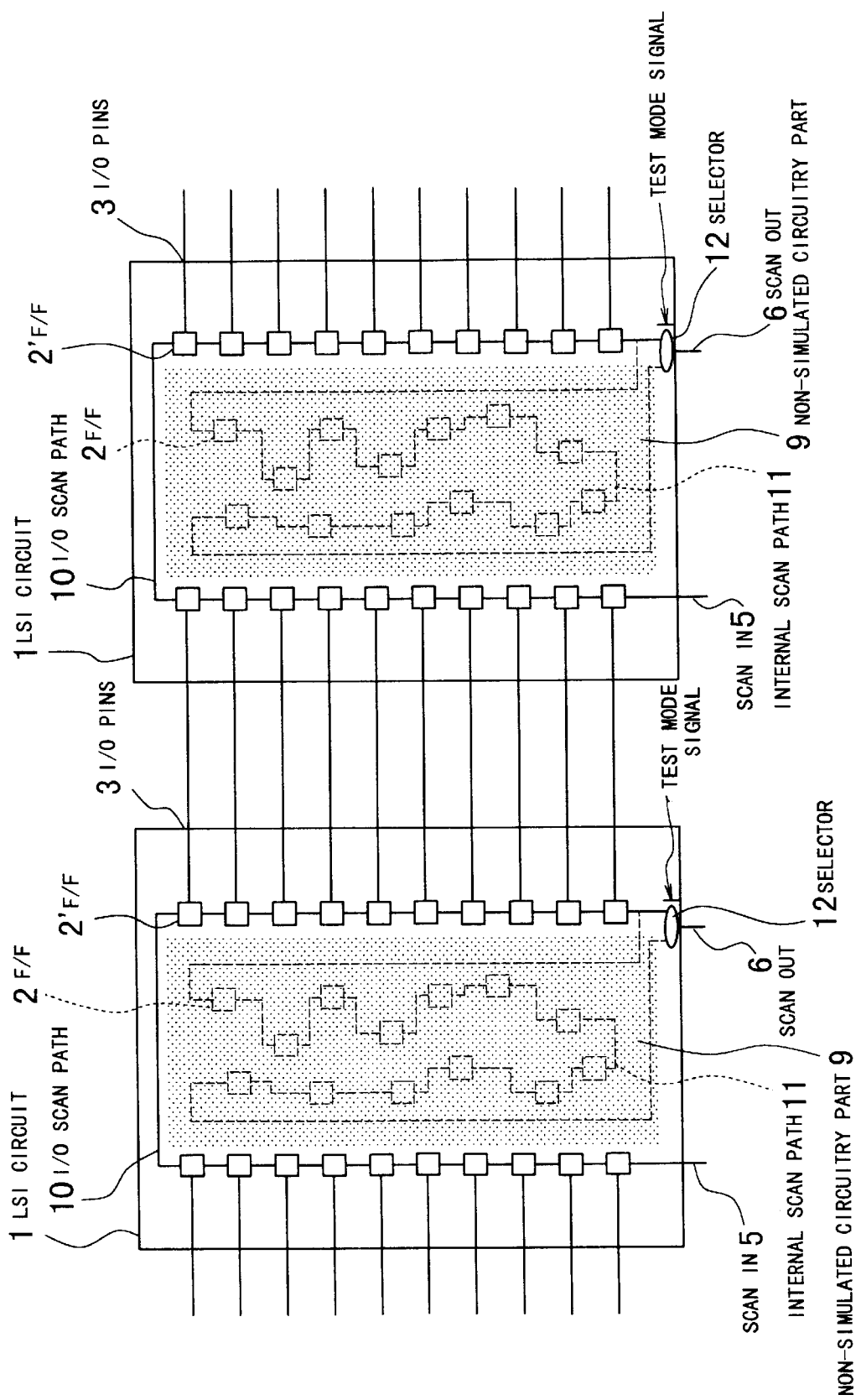
FIG. 1 is a drawing that shows the internal configuration of an LSI circuit according to the first embodiment of the present invention, and the associated board testing method.

FIG. 1 is a drawing that shows the internal configuration of an LSI circuit 1 according to the first embodiment of the present invention, and the form of connection for the purpose of executing a board test thereof.

The LSI circuit 1 according to this first embodiment of the present invention has a configuration that includes an I/O scan path 10 that is formed by the series connection of only flip-flops 2' that are in the region in the vicinity of the I/O pins, another scan path (hereinafter referred to as an internal scan path) 11 formed by the series connection of other flip-flops 2, and a selector 12 that selects either all scan paths (i.e., the I/O scan path 10 and the internal scan path 11) or only the I/O scan path 10.

In FIG. 1, the reference numeral 9 denotes the part of the circuit that is not subject to a simulation at the time of board testing using the I/O scan path 10, this being referred to hereinafter as the non-simulated circuitry.

The I/O scan path 10 has one end connected to the scan in 5 and the other end connected to one input of the selector 12 and to one end of the internal scan path 11.

The internal scan path 11 has one end connected to the other end of the I/O scan path 10 and to one input of the selector 12 and the other end connected to the other input of the selector 12.

The selector 12 has one input connected to other input of the I/O scan path 10 and to one end of the internal scan path 11 and the other input connected to the other end of the internal scan path 11, and has its output connected to the scan out 6 and, in response to a test mode signal, selects either all scan paths (i.e., the I/O scan path 10 and the internal scan path 11) or only the I/O scan path 10.

When performing a board test of the LSI circuit 1, connections are made between I/O pins 3, 3, ... of the LSI circuits 1, 1 ... and a test mode signal is from outside, so as to cause the selector 12 to select the I/O scan path 10 only.

Then test data is scanned in and out with respect to the I/O scan path 10 of each of the LSI circuits and data sent and received between the I/O scan paths 10, 10, ... thereof, so as to perform a verification of the connection between the LSI circuits 1, 1.

In the board test, since the main object is to perform a verification of connection between the LSI circuits 1, 1, the non-simulated circuitry 9 is eliminated from the simulation model used to generated test patterns.

Thus, it is possible to generate a test pattern using a small-scale simulation. Also, by reducing the test patterns, it is possible to reduce the amount of test time required.

Figure 4:
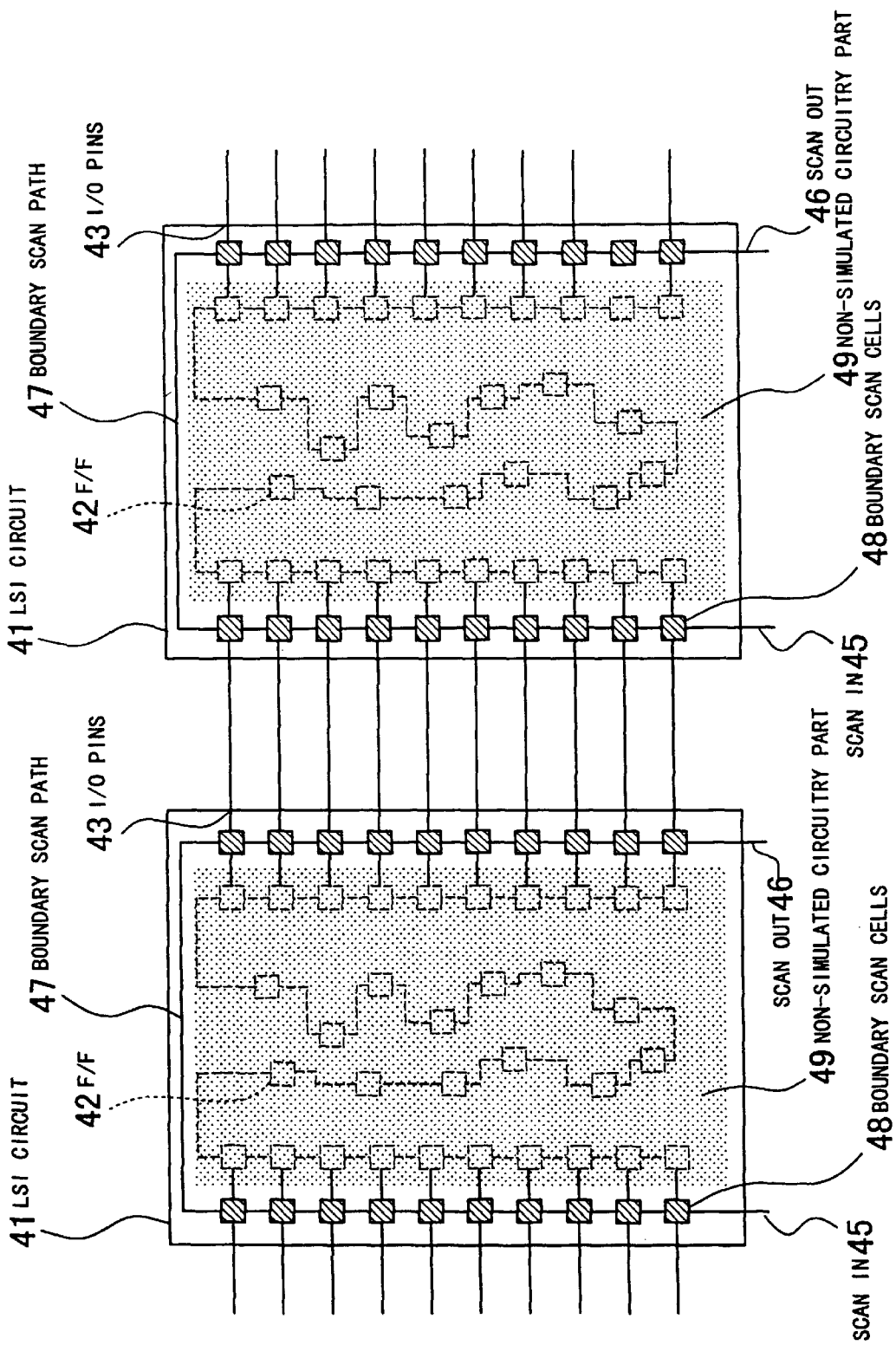
FIG. 4 is a drawing that illustrates a boundary scan path that is devised to simplify testing by noting only the connections between LSI circuits in the past.

In contrast to this embodiment of an LSI circuit according to the present invention, in which, of the originally existing flip-flops 2 and 2', for example, selective connection is made only of the flip-flops 2' that are near the I/O pins 3, in the boundary scan 47, which is shown in FIG. 4, separate from the originally existing flip-flops 42 and 42', a boundary scan 47 formed by boundary scan cells 48 must be provided as a dedicated circuit for the purpose testing. Using the LSI circuit 1 according to this embodiment of the present invention, however, a flip-flops 2' for the purpose of holding calculation data in logic circuitry or establishing synchronization is provided in a region near the I/O pins 3, so that without having to specially provide flip-flops for the purpose of facilitating testing, it is possible avoid an increase in delay by making use of the already-provided flip-flops 2'.

Next, the operation of an LSI circuit 1 according to the first embodiment of the present invention will be described, with reference being made to FIG. 1.

When the LSI circuit 1 operates, data transmission and receiving is usually performed by the flip-flops 2 and 2' in the parallel direction (left-to-right direction in FIG. 1). Naturally, there are various internal logic circuit input and outputs that are connected to the flip-flops 2 and 2' in the parallel direction, these not, however, being shown in the drawing.

In the shift mode, it is possible to set an arbitrary value in the serial direction (vertical direction in FIG. 1) from the scan in 5, shifting by one bit at a time so as to set the flip-flops 2 and 2' to this value. It similarly possible to extract the values the flip-flops 2 and 2' within the LSI circuit 1 by shifting one bit at a time from the scan out 6.

Additionally, by applying a test mode signal from outside so as to control the selector 12, it is possible to create a path using only the I/O scan path 10 formed by connecting in series, only the flip-flops 2' in the vicinity of the I/O pins 3 and that bypasses the internal scan path 11 of the other connected flip-flops 2.

In a board test, the main object of which is to verify the connection between the LSI circuits 1, 1, by selecting this scan path, that is, by selecting the I/O scan path 10, it is possible to form a scan path of only the part that is related to the connection between the LSI circuits 1, 1.

Therefore, by performing a shift operation to the scan path 10 from the scan in 5 to set a value and sending and receiving data in the parallel direction, it is then possible to perform a shifting operation, this time form the scan out 6 of the I/O path 10, so as to extract the result of sending and receiving data, thereby enabling the execution of a board test without controlling the non-simulated circuitry part 9 that is not related to the connection between the LSI circuits 1.

The test data of the I/O scan path 10 is thus generated by performing a simulation with regard to only the I/O scan path 10 of the LSI circuit 1, which is the device under test.

In this manner, using a board test method that employs the I/O scan path 10, a logic circuit verification is not performed of the internal non-simulated circuitry part 9 from the I/O pins 3 of the LSI circuit 1.

The non-simulated circuit part 9 of the LSI circuit 1 is functionally tested beforehand, using an LSI device tester, the internal circuitry of the LSI circuit remaining untouched during the board test, in which a reliably verification is performed as to whether the LSI circuits are connected properly.

As described above, in a board test method which employs an I/O path scan, by performing sending and receiving of signals with respect to the outside via the I/O pins 3 of each of the plurality of LSI circuits, a failed network between the LSI circuits 1 is detected.

In current high-density boards, in the case in which the operation of LSI circuits 1 is guaranteed and includes an operating margin, failures of the LSI circuit 1 cannot occur because of thermal history in production processes in which the heating conditions are controlled as prescribed, the result being that almost all failures occur as network failures such as shorts and opens that occur during connection processes such as soldering.

This is the reason that the detection ratio with respect to connection failures between the LSI circuits 1 is improved by using a board test method that employs an I/O scan path 10.

While in the above-noted description, in an LSI circuit 1 and a board test method therefor according to the first embodiment of the present invention as shown in FIG. 1, the connection is made in the sequence of scan in 5, I/O scan path 10, internal scan path 11, and finally scan out 6, with one selector 12 being used to perform switching between all the scan paths and only the I/O scan path 10, there is no particular restriction imposed with regard to this sequence and with regard to the number of selectors 12 that are used.

For example, a configuration in which the connection sequence is scan in 5, internal scan path 11, I/O scan path 10, and finally scan out 6 can be envisioned, as can one in which the I/O scan path 10 or internal scan path 11 does is not each grouped together.

Figure 2:
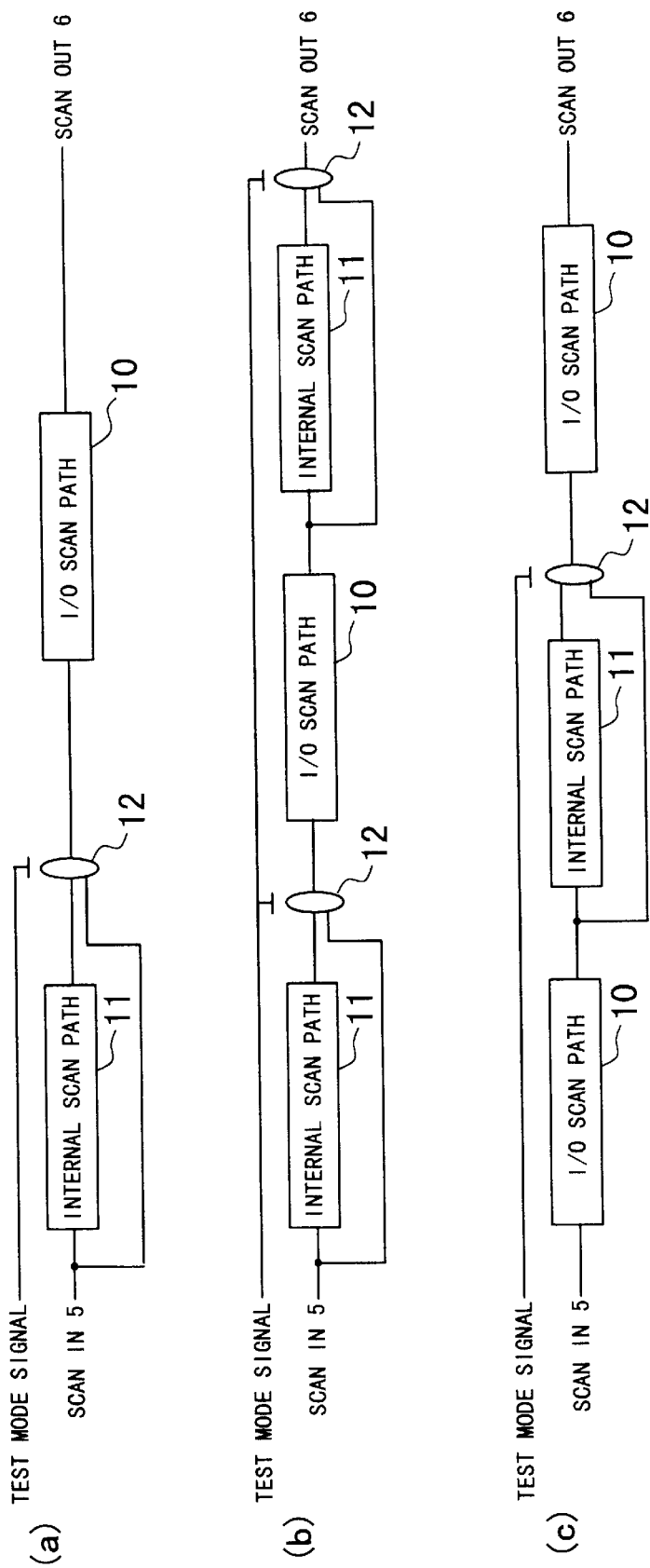
FIGS. 2(*a*), (*b*), and (*c*) are drawings that show examples of forms of connections between scan paths of an LSI circuit according to the second embodiment of the present invention.
Figure 3:
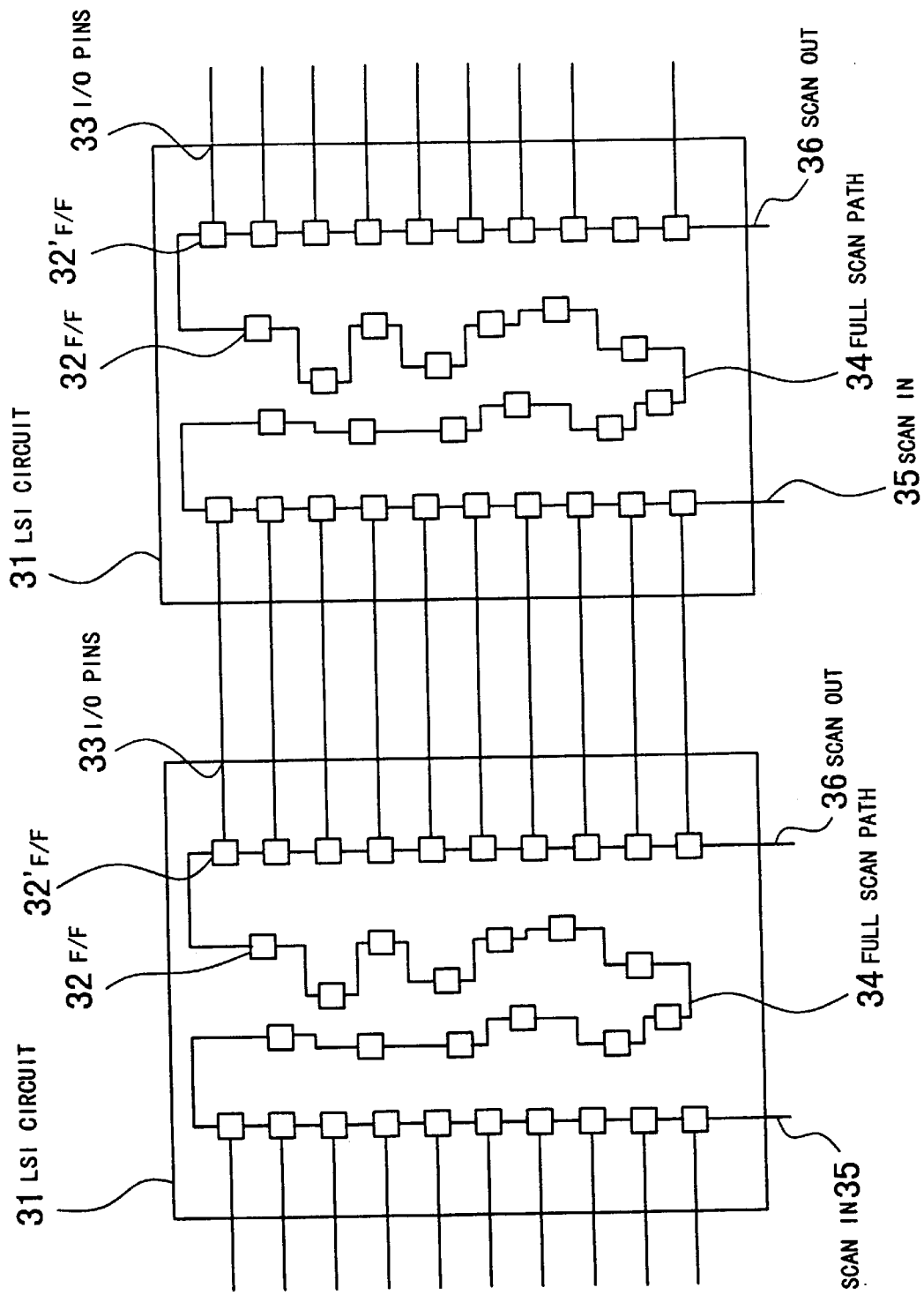
FIG. 3 is a drawing that shows an example of a full scan path in a easily testable circuit in the path.

FIGS. 2(a), (b), and (c) are drawings that show examples of a LSI circuit according to a second embodiment of the present invention, these having differences in the scan path sequence an number of selectors.

In the example that is shown in FIG. 2(a), the scan path is divided into the internal scan path 11 and the I/O scan path 10, and the LSI circuit further has a selector 12, one input of which is connected to the scan in 5 and one end of the internal scan path 11, the other input of which is connected to the other end of the input scan path 11, and the output of which is connected to one end of the I/O scan path 10, whereby, based on a test mode signal, switching is performed between all scan paths and only the I/O scan path 10.

It is obvious that, in the case of an LSI circuit with even this mode of connection, it is possible to apply the board testing method the same as in the case of the first embodiment of the LSI circuit, and also that the same type of effect can be achieved as in the first embodiment.

In the example that is shown in FIG. 2(b), the scan path is divided into an I/O scan path 10 and first and second internal scan paths 11, and the LSI circuit 1 further has a first selector 12, one input of which is connected to the scan in 5 and to one end of the first internal scan path 11, the other input of which is connected to the other end of the first internal scan path 11, and the output of which is connected to one end of the I/O scan path 10, and a second selector 12, one input of which is connected to the other end of the I/O scan path 10 and to one end of the second internal scan path 11, the other input of which is connected to the other end of the second internal scan path 11, and the output of which is connected to the scan out 6.

It is obvious that in the case of an LSI circuit configured in this manner as well, it is possible to apply the same type of board test method as in the case of the LSI circuit 1 according to the first embodiment and also possible to obtain the same affect.

In the example that is shown in FIG. 2(c), the scan path is divided into first and second I/O scan paths 10, and an internal scan path 11, this LSI circuit further having a selector 12, one input of which is connected to the other end of the first I/O scan path 10 and to one end of the internal scan path 11, the other input of which is connected to the other end of internal scan path 11, and the output of which is connected to one end of the second I/O scan path 10, wherein, based on a test mode signal, this selector 12 selects either all scan paths or only the first and second I/O scan paths. With regard to the LSI circuit configured in this manner as well, it is obvious that it is possible to apply the same board testing method as in the case of the LSI circuit according to the first embodiment, and also to obtain the same type of effect.

The first effect of the present invention is that, by adopting the technical constitution that is described above, the present invention facilitates the generation of a test pattern. The reason for this is that, by configuring an I/O scan path with only flip-flops that are in a region near the I/O pins, it is possible to perform a simulation separate from the other flip-flops and internal logic circuitry.

The second effect of the present invention is that it enables a minimization of circuit overhead. By doing so, it is possible to minimize the delay incurred in the normal operating mode. The reason for this is that, the scan path is formed by selectively connecting only those flip-flops of the originally existing flip-flops which are near I/O pins.

The third effect is that the present invention enables a shortening of the test time required to perform a board test. The reason for this is that the scale of the circuit under test is limited to the I/O scan path, thereby reducing the amount of the test patterns as well.

What is claimed is:

1. A large-scale integrated circuit having a structure that has a scan path formed by a series connection of flip-flops, said scan path being divided into an I/O scan path formed by a series connection of only flip-flops, each of which is in a region near the respective I/O pins, and an internal scan path formed by a series connection of flip-flops other than those as afore-mentioned, and said large-scale integrated circuit further comprising a selector that selects either all scan paths or only said I/O scan path.

2. The circuit as claimed in claim 1, wherein said I/O pins constitute I/O pins for a single large-scale integrated circuit chip, and wherein said I/O scan path and said internal scan path are contained in said single large-scale integrated circuit chip.

3. A large-scale integrated circuit having a structure that has a scan path formed by a series connection of flip-flops, said scan path being divided into an I/O scan path formed by a series connection of only flip-flops, each of which is in a region near the respective I/O pins, and an internal scan path formed by a series connection of flip-flops, other than those as afore-mentioned, and said large-scale integrated circuit further comprising a selector, one input of which is connected to the other end of said I/O scan path and to one end of said internal scan path, another input of which is connected to another end of said internal scan path, and an output of which is connected to a scan out, said selector, based on a test mode signal, selecting either all scan paths or only said I/O scan path.

4. The circuit as claimed in claim 3, wherein said I/O pins constitute I/O pins for a single large-scale integrated circuit chip, and wherein said I/O scan path and said internal scan path are contained in said single large-scale integrated circuit chip.

5. A large-scale integrated circuit having a structure that has a scan path formed by a series connection of flip-flops, said scan path being divided into an I/O scan path formed by a series connection of only flip-flops, each of which is in a region near the respective I/O pins, and an internal scan path formed by a series connection of flip-flops, other than those as afore-mentioned, and said large-scale integrated circuit further comprising a selector, one input of which is connected to a scan in and to one end of said internal scan path, another input of which is connected to another end of said internal scan path, and an output of which is connected to one end of said I/O scan path, said selector, based on a test mode signal, selecting either all scan paths or only said I/O scan path.

6. The circuit as claimed in claim 5, wherein said I/O pins constitute I/O pins for a single large-scale integrated circuit chip, and wherein said I/O scan path and said internal scan path are contained in said single large-scale integrated circuit chip.

7. A large-scale integrated circuit having a structure that has a scan path formed by a series connection of flip-flops, said scan path being divided into an I/O scan path formed by a series connection of only flip-flops, each of which is in a region near the respective I/O pins, that are in a region near an I/O pin, and first and second internal scan paths that are formed by a series connection of flip-flops, other than those as afore-mentioned, said large-scale integrated circuit further comprising a first selector, one input of which is connected to a scan in and to one end of said first internal scan path, another input of which is connected to another end of said first internal scan path, and an output of which is connected to one end of said I/O scan path, and a second selector, one input of which is connected to another end of said I/O scan path and to one end of said second internal scan path, another input of which is connected to another end of said second internal scan path, and an output of which is connected to a scan out, said first and second selectors, based on a test mode signal, selecting either all scan paths or only said I/O scan path.

8. The circuit as claimed in claim 7, wherein said I/O pins constitute I/O pins for a single large-scale integrated circuit chip, and wherein said I/O scan path, and said first internal scan path, and said second internal scan path are contained in said single large-scale integrated circuit chip.

9. A large-scale integrated circuit having a structure that has a scan path formed by a series connection of flip-flops, said scan path being divided into first and second I/O scan paths formed by only flip-flops, each of which is in a region near the respective I/O pins, and an internal scan path formed by a series connection of flip-flops, other than those as afore-mentioned, said large-scale integrated circuit further comprising a selector, one input of which is connected to another end of said first I/O scan path and to one end of said internal scan path, another input of which is connected to another end of said internal scan path, and an output of which is connected to one end of said second I/O scan path, said selector, based on a test mode signal, selecting either all scan paths or only said I/O scan paths.

10. The circuit as claimed in claim 9, wherein said I/O pins constitute I/O pins for a single large-scale integrated circuit chip, and wherein said first I/O scan path, said second I/O scan path, and said internal scan path are contained in said single large-scale integrated circuit chip.

11. A method of performing a board test of a plurality of large-scale integrated circuits having a structure having a scan path formed by a series connection of flip-flops, said scan path being divided into an I/O scan path formed by a series connection of only flip-flops, each of which is in a region near the respective I/O pins, and an internal scan path formed by a series connection of flip-flops, other than those as afore-mentioned, whereby connection is made between I/O pins of said plurality of integrated circuits, and further whereby a selector is used to select only said I/O scan path, test data being scanned into and out of said I/O scan paths of said plurality of integrated circuits so as to perform sending and receiving of data between said I/O scan paths, thereby verifying a connection between said large-scale integrated circuits.

12. The method as claimed in claim 11, wherein said I/O pins constitute I/O pins for a single large-scale integrated circuit chip, and wherein said I/O scan path and said internal scan path are contained in said single large-scale integrated circuit chip.

13. A method of performing a board test of a plurality of large-scale integrated circuits having a structure having a scan path formed by a series connection of flip-flops, said scan path being divided into an I/O scan path formed by a series connection of only flip-flops, each of which is in a region near the respective I/O pins, and an internal scan path formed by a series connection of flip-flops, other than those as afore-mentioned, whereby connection is made between I/O pins of said plurality of integrated circuits and a test mode signal is applied from outside, so that test data is scanned into and out of said I/O scan path of each of said plurality of integrated circuits, so as to perform sending and receiving of data between said I/O scan paths, thereby verifying a connection between said plurality of large-scale integrated circuits.

14. The method as claimed in claim 13, wherein said I/O pins constitute I/O pins for a single large-scale integrated circuit chip, and wherein said I/O scan path and said internal scan path are contained in said single large-scale integrated circuit chip.

15. A large-scale integrated circuit formed in a large-scale integrated circuit chip, comprising:

a I/O scan path formed by a series connection of I/O scan path flip-flops contained in said large-scale integrated circuit chip;

an internal scan path formed by a series connection of internal scan path flip-flops contained in said large-scale integrated circuit chip;

I/O pins for inputting data to and outputting data from said large-scale integrated circuit chip, wherein said I/O scan path flip flops are disposed in a region near the said I/O pins; and a selector that selects either a combined scan path, which comprises said I/O scan path and said internal scan path, or only said I/O scan path.

16. The large-scale integrated circuit, as claimed in claim 15, wherein a first selector input of said selector is connected to a first end of said I/O scan path and a first end of said internal scan path, wherein a second selector input of said selector is connected to a second end of said internal scan path, wherein a selector output of said selector is connected to a scan output terminal, and wherein said selector selectively connects said first selector input to said selector output and selectively connects said second selector input to said selector output based on a test mode signal.

17. The large-scale integrated circuit, as claimed in claim 15, wherein a first selector input of said selector is connected to a first end of said internal scan path and a scan input terminal, wherein a second selector input of said selector is connected to a second end of said internal scan path, wherein a selector output of said selector is connected to a first end of said I/O scan path, and wherein said selector selectively connects said first selector input to said selector output and selectively connects said second selector input to said selector output based on a test mode signal.

18. A large-scale integrated circuit formed in a large-scale integrated circuit chip, comprising:

a I/O scan path formed by a series connection of I/O scan path flip-flops contained in said large-scale integrated circuit chip;

a first internal scan path formed by a series connection of first internal scan path flip-flops contained in said large scale integrated circuit chip;

a second internal scan path formed by a series connection of second internal scan path flip-flops contained in said large-scale integrated circuit chip;

I/O pins for inputting data to and outputting data from said large-scale integrated circuit chip, wherein said I/O scan path flip flops are disposed in a region near the said I/O pins;

a first selector, wherein a first selector input of said first selector is connected to a first end of said first internal scan path and a scan input terminal, wherein a second selector input of said first selector is connected to a second end of said first internal scan path, wherein a selector output of said first selector is connected to a first end of said I/O scan path; and a second selector, wherein a first selector input of said second selector is connected to a first end of said second internal scan path and a second end of said I/O scan path, wherein a second selector input of said second selector is connected to a second end of said second internal scan path, wherein a selector output of said second selector is connected to a scan output terminal.

19. The circuit as claimed in claim 18, wherein said first selector selectively connects said first selector input of said first selector to said selector output of said first selector, wherein said first selector selectively connects said second selector input of said first selector to said selector output of said first selector, wherein said second selector selectively connects said first selector input of said second selector to said selector output of said second selector, and wherein said second selector selectively connects said second selector input of said second selector to said selector output of said second selector.

20. A large-scale integrated Circuit formed in a large-scale integrated circuit chip, comprising:

a first I/O scan path formed by a series connection of first I/O scan path flip-flops contained in said large-scale integrated circuit chip;

a second I/O scan path formed by a series connection of second I/O scan path flip-flops contained in said large-scale integrated circuit chip;

an internal scan path formed by a series connection of internal scan path flip-flops contained in said large-scale integrated circuit chip;

I/O pins for inputting data to and outputting data from said large-scale integrated circuit chip, wherein said first and second I/O scan path flip flops are disposed in a region near the said I/O pins; and a selector, wherein a first selector input of said selector is connected to a first end of said first I/O scan path and a first end of said internal scan path, wherein a second selector input of said selector is connected to a second end of said internal scan path, wherein a selector output of said selector is connected to a first end of said second I/O path, and wherein said selector selectively connects said first selector input to said selector output and selectively connects said second selector input to said selector output.

* * * * *